United States Patent [19]

Takeda

[11] 4,157,261

[45] Jun. 5, 1979

[54] TRANSFER PROCESS WITH POLYESTER (METH)ACRYLATE AS PHOTOPOLYMER

[75] Inventor: Keiji Takeda, Asaka, Japan

[73] Assignee: Fuji Photo Film Co., Ltd., Minami-ashigara, Japan

[21] Appl. No.: 834,947

[22] Filed: Sep. 20, 1977

Related U.S. Application Data

[63] Continuation of Ser. No. 645,132, Dec. 29, 1975, abandoned.

[30] Foreign Application Priority Data

Dec. 27, 1974 [JP] Japan ................................. 50-679

[51] Int. Cl.$^2$ .................. G03C 11/12; G03C 1/68; G03C 5/00
[52] U.S. Cl. .................................. 96/28; 96/35.1; 96/115 R; 96/115 P
[58] Field of Search ................ 46/28, 35.1, 115 R, 46/115 P

[56] References Cited

U.S. PATENT DOCUMENTS

| | | | |
|---|---|---|---|
| 2,760,863 | 8/1956 | Plambeck | 96/115 P |
| 3,622,320 | 11/1971 | Allen | 96/28 |
| 3,676,145 | 7/1972 | Protzman | 96/28 X |
| 3,732,107 | 5/1973 | Faust | 96/115 P |
| 3,770,438 | 11/1973 | Celeste | 96/115 P X |
| 3,775,112 | 11/1973 | Alsup | 96/115 X |
| 3,923,523 | 12/1975 | Nishikubo et al. | 96/35.1 X |
| 4,050,936 | 9/1977 | Takeda et al. | 96/28 |

*Primary Examiner*—Edward C. Kimlin
*Attorney, Agent, or Firm*—Sughrue, Rothwell, Mion, Zinn and Macpeak

[57] ABSTRACT

In an image forming process which comprises imagewise exposing to light a laminate composed of a substrate, a photosensitive composition layer and a transparent support, superposed in that order, through the support, removing either the exposed portion or the unexposed portion of the photosensitive composition layer together with the support while adhered thereto, peeling off the support to leave the other of the exposed portion or the unexposed portion of the photosensitive composition layer on the substrate, the improvement where the photosensitive composition comprises:

(1) a reaction product prepared by the esterification of: (a) at least one of acrylic acid and methacrylic acid, (b) at least one polybasic acid and (c) at least one polyhydric alcohol;

(2) a photo-polymerization initiator; and (3) a binder.

12 Claims, No Drawings

TRANSFER PROCESS WITH POLYESTER (METH)ACRYLATE AS PHOTOPOLYMER

This is a continuation of application Ser. No. 645,132, filed Dec. 29, 1975, now abandoned.

BACKGROUND OF THE INVENTION

1. Field of the Invention

The present invention relates to an image forming process and, particularly, to a dry type process for recording images using a photo-polymerizable material.

2. Description of the Prior Art

Heretofore, as photoresist materials for producing printed circuits, solvent development type recording materials such as a photosensitive liquid comprising a combination of a bichromate and glue or polyvinyl alcohol, a photosensitive liquid comprising polyvinyl cinnamate and a sensitizing agent as main ingredients or a photosensitive liquid comprising natural rubber or cyclized rubber and a cross-linking agent as main ingredients have been commonly used.

There are also known photoresist materials which comprise a photosensitive material inserted between two plastic films. In such photoresist materials, one of the plastic films is stripped off to expose the photosensitive material upon use. After being superposed on a desired substrate for printed circuits, (e.g., a copperized plate), the photosensitive layer is image-wise exposed to light through the remaining plastic film. The remaining plastic film is then removed and the photosensitive layer developed by a suitable developer such as an organic solvent or an aqueous alkali solution, etc. The photosensitive layer hardened by exposure remains on the substrate while non-exposed areas are removed by dissolution in a developer to form a resist pattern for printed circuit manufacture. However, processing the above described solvent development type recording materials is complicated as a developer must be used. The developers commonly used result in waste liquids which pose a danger of environmental pollution.

Recently, dry development type image recording materials and processes have been proposed as an alternative to the above described solvent development type recording materials, e.g., in Japanese Patent Publications 9663/63 and 22901/68, Japanese Patent Application (OPI) 7728/72, Japanese Patent Publication 43126/73 and Japanese Patent Application (OPI) 33623/72, processes are described for forming images utilizing a photosensitive layer where the degree of adhesion of exposed areas and unexposed areas to the support or to the substrate are reversed, for example, the adhesion of the photosensitive layer to the substrate is high in exposed areas while the adhesion of the photosensitive layer to the support is low in the unexposed portion. This process generally comprises applying a photo-polymerizable composition comprising an addition polymerizable monomer, a photo-polymerization initiator and a binder as a photosensitive layer to a transparent support such as a thin transparent plastic film, laminating the photosensitive layer on a transparent or opaque substrate such as a metal plate, a plastic plate or film, or paper, etc., image-wise exposing to light through the transparent support using an original and stripping off the support to leave either the exposed portion or the unexposed portion of the photosensitive layer on the substrate or the support, by which positive images are formed on one of the substrate and the support and negative images are formed on the other. According to this recording process, an image resist pattern can be formed merely by stripping off the support, i.e., development in a liquid is omitted. Accordingly, the production of the printed circuits becomes more economical and simpler from the production viewpoint. Further, there is no danger of environmental pollution as waste liquid is not generated.

As the addition polymerizable monomers used in the phososensitive layer of such dry (stripping) type developable recording materials, heretofore acrylic acid esters or methacrylic acid esters prepared from acrylic acid or methacrylic acid and polyhydroxy compound, such as pentaerythritol triacrylate, pentaerythritol trimethacrylate, trimethylolpropane triacrylate or diethyleneglycol diacrylate, as described in Japanese Patent Publication 15932/66 and Japanese Patent Application (OPI) 7728/72, have been used.

On the other hand, though may high molecular weight materials are described in the above patent publications as the binder constituent of the photosensitive layer, only a few limited materials such as chlorinated rubber can be used as a main ingredient of the binder when the substrate is composed of metal. According to studies by the inventor, it has been confirmed it is necessary to use chlorinated rubber as a main ingredient in order to obtain good images by stripping development. Further, it has been found that chlorinated polyolefins are suitable as a binder to obtain good images by stripping development in the case of using the above described monomers (see Japanese Patent Application 97049/73).

In the production of a resist pattern on a substrate, there are cases where all of the resist pattern is intimately adhered to a substrate such as a copper plate superposed on a plastic plate. On the other hand, in the case of producing a printed circuit using a substrate having "through holes", where both the surface of the substrate and the inside faces of the through-holes are covered with a metal layer so that circuits formed on both surfaces of the substrate are connected by electrical conduction through the inside faces of the through holes, it is necessary to form a resist film over the through holes without contacting the resist film with the metal surface on the through holes (this is called tenting).

Tenting is necessary to prevent etching of the metal layer on the inside face of the through holes when printed circuits are formed by etching. In the case of such tenting, it is required that the resist film formed adhere closely to the substrate at only very small areas around the through holes while other portions of the resist film be supported by the cohesive force of the film over the through holes, and that such a film have a strength sufficient to endure the mechanical shock of the spraying pressure in a spray type etching process.

It has become clear, as a result of studies by the inventor, that though stripping development type photoresist films prepared using the above described esters of acrylic acid or methacrylic acid and polyhydroxy compounds as a monomer and the above described chlorinated rubber or chlorinated polyolefins as a main ingredient of the binder have sufficient resistance where the whole resist pattern is intimately adhered to the substrate, they do not have strength sufficient to withstand spraying pressure at etching when they are used for tenting.

SUMMARY OF THE INVENTION

A first object of the present invention is to provide an image forming process which comprises forming a photoresist pattern of high strength by stripping development, which can be used for tenting.

A second object of the present invention is to provide an image forming process by which a photoresist pattern can be formed by exposure to light for a shorter period of time, namely, at a higher speed, than prior art stripping development type photoresist materials.

The inventor searched for monomer-binder combinations which provided good images by stripping development (or peeling-off development as such is sometimes termed in the art), and, at the same time, gave strong resist films useful for tenting purposes.

For the first time, such has been achieved by the use of binder polymers of higher strength (e.g., of higher molecular weight) than chlorinated polyolefins. The latter polymers are known to provide good images upon stripping development when (meth)acrylate monomers are used, but do not give a resist film strong enough for tenting, while other stronger polymers did not provide images when the same monomers were used. Therefore, the inventor searched for monomers which will give good images by stripping development even with the use of polymers that have higher strength than chlorinated polyolefins.

Secondly, the above objects can be achieved by using monomers which produce strong polymers useful for tenting by photo-polymerization from the monomers themselves, even with the use of chlorinated polyolefin as a binder.

After extensive research along the above lines, the inventor reached the present invention.

The present invention provides an image forming process which comprises image-wise exposing to light a laminate comprising a substrate, a layer of a photosensitive composition and a transparent support, which are superposed in the recited order, through the support, and removing exposed areas or nonexposed areas of the layer of the photosensitive composition together with the support to which the portion of the layer is adhered, by peeling off the support so as to leave the other areas (exposed or unexposed) of the layer of the photosensitive composition on the substrate, and is characterized by the use of a photosensitive composition comprising:

(1) a reaction product prepared by the esterification of three components consisting of (a) at least one of acrylic acid and methacrylic acid; (b) a polybasic acid and (c) a polyhydric alcohol;

(2) a photo-polymerization initiator; and (3) a binder.

The above reaction product (1) corresponds to an addition polymerizable polyester acrylate and/or polyester methacrylate or polyester acrylate-methacrylate.

DETAILED DESCRIPTION OF PREFERRED EMBODIMENTS

A most important characteristic of the present invention is to use the reaction product (1) described above, that is, the addition polymerizable polyester acrylate and/or polyester methacrylate or polyester acrylate-methacrylate (hereinafter, collectively called a polyester (meth)acrylate for purposes of brevity) as a monomer component of the photosensitive layer, whereby many kinds of polymers having high strength can be used as a main ingredient of the binder without being limited to specific polymers such as chlorinated polyolefins, whereby images having good quality similar to those formed by a process wherein chlorinated rubbers or chlorinated polyolefins are used as the binder can be obtained by stripping development and a photoresist film having a strength high enough to be used for tenting can be obtained.

Further, in the present invention a resist film having high strength can be obtained even if one or more chlorinated polyolefins are used as the binder.

In addition, in the present invention a photoresist film having higher sensitivity than those of the prior art is provided by the use of the above described monomers.

The addition polymerizable polyester (meth)acrylate used in the photosensitive material for the image recording process of the present invention is a reaction product prepared by the esterification of acrylic acid and/or methacrylic acid, one or more polybasic acids and one or more polyhydric alcohols, which is represented by the formula (I):

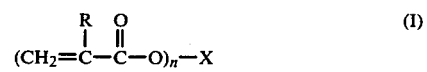

wherein R represents a hydrogen atom or a methyl group, X represents an ester group containing at least one ester bond which comprises one or more polyhydric alcohols and one or more polybasic acids, and n represents an integer of 1 to 6. Preferred reaction products as above described have a molecular weight of from 246 to about 3,000, more preferably from 284 to about 2,000.

As the polyhydric alcohol comprising part of the ester group X, there are polyhydric alcohols such as ethylene glycol, 1,2-propylene glycol, 1,4-butanediol, 1,6-hexanediol, trimethylolpropane, trimethylolethane, 1,2,6-hexanetriol, glycerine, pentaerythritol and sorbitol, and polyether type polyhydric alcohols such as diethylene glycol, triethylene glycol, tetraethylene glycol, polyethylene glycol, dipropylene glycol, tripropylene glycol and polypropylene glycol. Preferred polyethylene glycols have a molecular weight of from 60 to about 600, more preferably from 60 to about 400, and preferred polypropylene glycols have a molecular weight of from 76 to about 700, more preferably from 76 to about 500. Preferred polyhydric alcohols are aliphatic polyhydroxy compounds which contain from 2 to 30 carbon atoms, more preferably from 2 to 20 carbon atoms, and have from 2 to 6 —OH groups, more preferably from 2 to 4 —OH groups. Good results are obtained utilizing such aliphatic polyhydroxy compounds having a molecular weight of from 60 to about 700, more preferably from 60 to about 500.

On the other hand, as the polybasic acid comprising a part of the ester group X, there are aromatic polybasic acids such as phthalic acid, isophthalic acid, terephthalic acid, tetrachlorophthalic acid, tetrabromophthalic acid, trimellitic acid, pyromellitic acid, benzophenone dicarboxylic acid, resorcinol diacetic acid and bisphenol A diacetic acid, unsaturated aliphatic polybasic acids such as maleic acid, fumaric acid, citraconic acid, mesaconic acid, itaconic acid, and 5-norbornene-2,3-dicarboxylic acid, and saturated aliphatic polybasic acids such as malonic acid, succinic acid, glutaric acid, adipic acid, pimelic acid, sebacic acid, dodecanoic acid, tetrahydrophthalic acid and norbornane-2,3-dicarboxylic acid. Preferred polybasic acids have from 3 to 30 carbon atoms, more preferably from 4 to 20 carbon atoms (includng the carboxylic carbon atom) and contain from 2 to 6 —COOH groups, more preferably from 2 to 4 —COOH groups. Such polybasic acids have a molecular weight of from 104 to about 600, with excellent results being obtained using polybasic acid having a molecular weight of from 116 to about 500.

For those polybasic acids which comprise an aromatic ring, such a ring may be substituted and, in such instance, the substituent is most preferably an alkyl group of from 1 to 5 carbon atoms, halogen (Cl, Br, I) or a haloalkyl group comprising an alkyl moiety of from 1 to 5 carbon atoms and Cl, Br or I.

As indicated, the ester group X includes those composed of one polyhydric alcohol and two or more polybasic acids and those composed of two or more polyhydric alcohols and one or more polybasic acids. Further, the ester group X includes those containing one molecule of polyhydric alcohol and one molecule of polybasic acid and those containing two or more molecules of one or both of the polyhydric alcohol and the polybasic acid. In short, any ester group X can be used if at least one ester bond is present.

Further, the ester group X includes those having a hydroxyl group, those having a hydroxyl group esterified by a monobasic carboxylic acid, preferably an aliphatic acid of 1 to 10 carbon atoms, most preferably 1 to 5 carbon atoms (excluding the carboxylic carbon) or an aryl carboxylic acid comprising 1 or 2 aromatic rings, preferably 1 ring, and from 6 to 15 carbon atoms, more preferably 6 to 10 carbon atoms (excluding the carboxylic carbon), and those having a hydroxyl group substituted by an alkoxy group, preferably an alkoxy group with from 1 to 5 carbon atoms, such as methoxy group or ethoxy group. Further, X may contain a carboxyl group, i.e., a free carboxyl group(s) which is not esterified. For instance, an example of such an X group containing a carboxyl group is:

```
Y—PH—PB—PH—Y
       |
       PB
       |
       COOH   free carboxyl
```

The number of n in formula (I) and the number of the ester bonds include in X can be controlled by changing the kind and molar ratio of acrylic acid or methacrylic acid, polyhydric alcohol and polybasic acid in the production of the polyester (meth)acrylate. It is generally preferred that the value of n be 1 to 6 to prevent gelation during synthesis. When the value of n is 2 or more, a polyester (meth)acrylate wherein either only an acryloyl group or only a methacryloyl group is included in one molecule may be used or a polyester (meth)acrylate wherein both an acryloyl group and a methacryloyl group are included at a desired ratio in one molecule may be used. The polyester (meth)acrylate used can be selected according to the sensitivity required for the image recording process of the present invention or the properties of the film obtained after photo-polymerization.

For example, the ester group of the present invention can take various forms some of which include, for instance (where PH represents a polyhydric alcohol and PB represents a polybasic acid): $Y_l$—PH—PB—PH—$Y_m$, $Y_l$–(PH-PB)$_x$PH-$Y_m$,

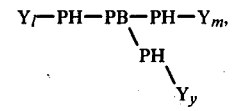

and the like, wherein Y is

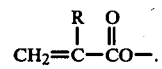

The polyester (meth)acrylate can be easily synthesized in a yield of 80% of more by heating a solution containing acrylic acid or methacrylic acid, polyhydric alcohol and polybasic acid in the ratio desired in the final product at 60° to 100° C. in the presence of a heat polymerization inhibitor such as hydroquinone, p-methoxyphenol or phenothiazine (0.1 to 0.01% by weight based on the sum total of acrylic acid and methacrylic acid) and a dehydration catalyst such as sulfuric acid or zinc chloride (0.1 to 0.01% by weight based on the sum total of acrylic acid and methacrylic acid) (see Japanese Patent Publication (OPI) 133491/74).

Examples of the polyester (meth)acrylate used in the present invention are shown in Table 1 wherein the chemical formulae (based upon the composition of the reactants utilized to synthesize the polyester (meth)acrylate) are shown together with the polyhydric alcohol(s) and polybasic acid(s) which compose the ester group and the number n of the polymerizable functional group(s) in one molecule. However, other various kinds of polyester (meth)acrylates can be suitable used in the present invention. In Table 1, Y in the formula represents either an acryloyl group ($CH_2$=CH—CO—) or a methacryloyl group

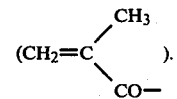

TABLE 1

| Polyester (meth)acrylate | Polyhydric alcohol | Polybasic acid | n |
|---|---|---|---|
| Y—OCH$_2$CH$_2$OOC—CH=CH—COOCH$_2$CH$_2$OH | Ethylene glycol | Maleic acid | 1 |
| Y—OCH$_2$CH—OOC—CH$_2$CH$_2$—COO—CHCH$_2$OH<br>　　　　|　　　　　　　　　　　　　　　　　　|<br>　　　CH$_3$　　　　　　　　　　　　　　　　　CH$_3$ | Propylene glycol | Succinic acid | 1 |
| Y—O(CH$_2$CH$_2$O)$_2$OC—C$_6$H$_4$—CO(OCH$_2$CH$_2$)$_2$OH | Diethylene glycol | Phthalic acid | 1 |
| Y(O(CH$_2$)$_4$OOC((CH$_2$)$_4$—CO)$_2$(CH$_2$)$_4$OOC—CH$_3$ | 1,4-Butanediol | Adipic acid | 1 |
|  |  | Acetic acid |  |
| Y—OCH$_2$CH$_2$OOC—C$_6$H$_4$—COOCH$_2$CH$_2$O—Y | Ethylene glycol | Terephthalic acid | 2 |
| Y—OCH$_2$CH$_2$OOC—C$_6$H$_4$—CO(OCH$_2$CH$_2$O—Y | Ethylene glycol | Phthalic acid | 2 |
| Y—O(CH$_2$CH$_2$O)$_3$OC—CH=CH—CO(OCH$_2$CH$_2$O)$_3$—Y | Triethylene glycol | Fumaric acid | 2 |
| (norbornene diester structure) Y—OCH$_2$CH$_2$OOC ... COOCH$_2$CH$_2$O—Y | Ethylene glycol | 5-Norbornene-2,3-dicarboxylic acid | 2 |
| Y(O(CH$_2$CH$_2$)$_3$OOC—(CH$_2$)$_4$—CO)$_2$O(CH$_2$CH$_2$O)$_3$Y | Triethylene glycol | Adipic acid | 2 |
| Y(O(CH$_2$CH$_2$)$_2$OOC—C$_6$H$_4$—CO)$_3$O(CH$_2$CH$_2$O)$_2$Y | Diethylene glycol | Terephthalic acid | 2 |
| Y(OCH$_2$CH$_2$)$_{10}$OOC—CH$_2$—COO(CH$_2$CH$_2$O)$_{10}$—Y | Polyethylene glycol (molecular weight: 450) | Malonic acid | 2 |
| Y(OCH$_2$CH$_2$)$_{10}$OOC—[benzophenone-diester]—COO(CH$_2$CH$_2$O)$_{10}$—Y | Polyethylene glycol (molecular weight: 450) | Benzophenone-2,3-dicarboxylic acid | 2 |
| Y—OCH$_2$CH$_2$OOC—[trimellitate with COO—CH$_2$CH$_2$—O—Y branch]—COO—CH$_2$CH$_2$O—Y | Ethylene glycol | Trimellitic acid | 3 |
| Y(OCH$_2$CH$_2$)$_2$OOC—[trimellitate with COO(CH$_2$CH$_2$O)$_2$Y branch]—COO(CH$_2$CH$_2$O)$_2$Y | Diethylene glycol | Trimellitic acid | 3 |
| Y—OCH$_2$<br>　　　＞CH—OOC—C$_6$H$_4$—COO—CH＜CH$_2$O—Y<br>Y—OCH$_2$　　　　　　　　　　　　　　　CH$_2$O—Y | Glycerine | Phthalic acid | 4 |
| Y—OCH$_2$<br>　　　＞CH—OOC(CH$_2$)$_4$COO—CH＜CH$_2$O—Y<br>Y—OCH$_2$　　　　　　　　　　　　　　CH$_2$O—Y | Glycerine | Adipic acid | 4 |

TABLE 1-continued

| Polyester (meth)acrylate | Polyhydric alcohol | Polybasic acid | n |
|---|---|---|---|
| Y—OCH$_2$\C(C$_2$H$_5$)/CH$_2$O—Y with CH$_2$OOC—C$_6$H$_4$—COOCH$_2$ | Trimethylolpropane | Terephthalic acid | 4 |
| Y—OCH$_2$\C(C$_2$H$_5$)/CH$_2$O—Y with CH$_2$OOC—CH=CH—COOCH$_2$ | Trimethylolpropane | Maleic acid | 4 |
| Y—OCH$_2$\C(CH$_3$)/CH$_2$O—Y with CH$_2$OOC+CH$_2$+$_3$COOCH$_2$ | Trimethylolethane | Glutaric acid | 4 |
| Y—OCH$_2$, Y—OCH$_2$\C/CH$_2$O—Y, CH$_2$O—Y with CH$_2$OOC—C$_6$H$_4$—COOCH$_2$ | Pentaerythritol | Phthalic acid | 6 |
| Y—OCH$_2$, Y—OCH$_2$\C/CH$_2$O—Y, CH$_2$O—Y with CH$_2$OOC—CH=CH—COOCH$_2$ | Pentaerythritol | Fumaric acid | 6 |
| Y—OCH$_2$, Y—OCH$_2$\C/CH$_2$O—Y, CH$_2$O—Y with CH$_2$OOC—CH$_2$CH$_2$—COOCH$_2$ | Pentaerythritol | Succinic acid | 6 |
| Y—OCH$_2$CH$_2$OOC+(CH$_2$)$_4$—COO+CH$_2$+$_2$OH | Ethylene glycol<br>1,4-Butanediol | Adipic acid | 1 |
| Y+OCH$_2$CH$_2$+$_2$OOC—CH=CH—COO+CH$_2$CH$_2$O+$_2$OC—CH$_2$CH$_2$—COO+CH$_2$CH$_2$O+$_2$H | Diethylene glycol | Succinic acid<br>Maleic acid<br>Pimelic acid | 1 |
| Y—OCH$_2$CH(CH$_3$)—OOC+CH$_2$+$_5$COO+CH$_2$CH$_2$O+$_2$OC+CH$_2$+$_5$COOCHCH$_2$O—Y | Propylene glycol<br>Diethylene glycol | | 2 |
| Y—O+CH$_2$CH$_2$O+$_3$OC+CH$_2$+$_3$COO+CH$_2$CH$_2$O+$_3$OC—C(=CH$_2$)—CH$_2$CO+OCH$_2$CH$_2$+$_3$O—Y | Triethylene glycol | Adipic acid<br>Itaconic acid | 2 |
| Y+OCH$_2$CH$_2$+$_2$OOC+CH$_2$+$_3$COOCH$_2$<br>Y+OCH$_2$CH$_2$+$_2$OOC+CH$_2$+$_3$COOCH<br>Y+OCH$_2$CH$_2$+$_2$OOC+CH$_2$+$_3$COOCH$_2$ | Diethylene glycol<br>Glycerine | Glutaric acid | 3 |
| Y—OCH$_2$CH$_2$—OOC—C$_6$H$_4$—COOCH$_2$\C(C$_2$H$_5$)/CH$_2$—<br>Y—OCH$_2$CH$_2$—OOC—CH=CH—COOCH$_2$ | Ethylene glycol<br>Trimethylolpropane | Maleic acid<br>Phthalic acid | 3 |

TABLE 1-continued

| Polyester (meth)acrylate | Polyhydric alcohol | Polybasic acid | n |
|---|---|---|---|
| Y—OCH$_2$\\CH—OOC—C$_6$H$_4$—COO—CH$_2$CH$_2$—OOC—C$_6$H$_4$—COO—CH/CH$_2$O—Y\\CH$_2$O—Y<br>Y—OCH$_2$/ | Glycerine<br>Ethylene glycol | Terephthalic acid | 4 |
| Y—OCH$_2$\\C—CH$_2$OOC—CH=CH—COO(CH$_2$CH$_2$O)$_3$OC—CH=CH—COOCH$_2$—C/CH$_2$O—Y\\—CH$_2$O—Y\\CH$_2$O—Y<br>Y—OCH$_2$/ | Pentaerythritol<br>Triethylene glycol | Maleic acid | 6 |

Polyester (meth)acrylates used in the present invention are also available on the market. For example, Aronix M-5500, M-6100, M-6300, M-8030 and M-8060 produced by Toa Gosei Chemical Industry Co. can be suitably used in the present invention.

The effect of the present invention is exhibited even if the above described monomer, that is, the polyester (meth)acrylate, is used together with one or more other addition polymerization monomers in the image forming process. In this case, it is preferred that the polyester (meth)acrylate be incorporated in an amount of at least about 50 mol% based on the whole monomers. As such other addition polymerizable monomers which can be combined with the polyester (meth)acrylate, any compound(s) can be used if they have at least one addition polymerizable bond. As preferred examples of such compounds, there are acrylic or methacrylic acid esters produced by the esterification of acrylic acid or methacrylic acid with mono- or polyhydroxy compounds, for example, alkyl mono-acrylates or mono-methacrylates such as methyl acrylate or methacrylate, ethyl acrylate or methacrylate, butyl acrylate or methacrylate, and polyacrylates or methacrylates produced from acrylic acid and/or methacrylic acid and polyhydric alcohols such as ethylene glycol, propylene glycol, diethylene glycol, dipropylene glycol, polyethylene glycol, polypropylene glycol, 1,4-butanediol, glycerine, trimethylol ethane, trimethylol propane or pentaerythritol, etc. Further, there are acrylic or methacrylic acid amides such as acrylamide, methacrylamide, N-methyl acrylamide or methacrylamide, N-ethyl acrylamide or methacrylamide, N,N-dimethyl acrylamide or methacrylamide, methylenebisacrylamide or methacrylamide, ethylenediamine diacrylamide or methacrylamide, diaminopropane diacrylamide or methacrylamide and hexamethylenediamine diacrylamide or methacrylamide, etc.; allyl compounds such as allyl acetate, allyl caproate, allyl laurate, diallyl phthalate, diallyl adipate and diallyl maleate, etc.; vinyl ethers such as hexylvinyl ether, decyl vinyl ether, ethyleneglycol divinyl ether and glycerol trivinyl ether, etc.; vinyl esters such as vinyl butyrate, vinyl isobutyrate, divinyl succinate, divinyl adipate and divinyl phthalate, etc.; N-vinyl compounds such as N-vinyl carbazole and N-vinyl imidazole, etc.; and styrenes such as styrene, α-methylstyrene and divinylbenzene, etc.

The kind of monomer(s) used and the ratio(s) thereof to the polyester (meth)acrylate can be selected according to the desired properties, such as the strength of the film formed by photo-polymerization or the desired photo-polymerization rate.

In the image recording process of the present invention, an adhesive strength of the photosensitive layer to the support and to the substrate is an important factor. The adhesive strength can be adjusted by changing the ratio of the monomer(s) to the binder; further it can be adjusted by changing the kind of monomer(s) used. In general, the adhesive strength of the photosensitive layer to the support or to the substrate changes according to the number of acryloyl groups or methacryloyl groups in one polyester (meth)acrylate molecule or with the number and the kind of the ester bond. Accordingly, it is possible to prepare a photosensitive layer suitable for stripping development, corresponding to the surface properties of the support and the substrate to be used, by using a combination of various polyester (meth)acrylates in a suitable ratio or by using a combination of one or more polyester (meth)acrylates and one or more monomers at a suitable ratio.

As the photo-polymerization initiator, conventional materials can be suitably used in the present invention. Simply stated, any conventional photo-polymerization initiator can be utilized in the present invention which produces free radicals upon absorption of light, the free radicals then initiating free radical polymerization of the monomer(s) by addition to a double bond of the monomer(s). For example, there are carbonyl compounds, organic sulfur compounds, peroxides, redox type compounds, azo and diazo compounds, halogen compounds, light reducible dyestuffs and imidazoles, etc., as described in *Light-Sensitive Systems*, Chapter 5, written by J. Kosar. Typical examples of carbonyl compounds include benzoin, benzoin methyl ether, benzophenone, anthraquinone, 2-methylanthraquinone, 2-tert-butyl-anthraquinone, 9,10-phenanthrenequinone, diacetyl and benzil, etc.

Further, compounds having the following formula are useful.

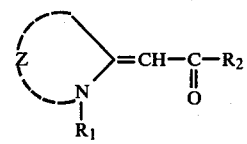

In the above formula, $R_1$ represents an alkyl group as is conventional in cyanine dyes, for example, an unsubstituted alkyl group such as methyl group, ethyl group or propyl group, etc., a hydroxyalkyl group such as 2-hydroxyethyl group, an alkoxyalkyl group such as 2-methoxyethyl group, a carboxyalkyl group such as carboxymethyl group or 2-carboxyethyl group, etc., a sulfoalkyl group such as 2-sulfoethyl group or 3-sulfopropyl group, etc., an aralkyl group such as benzyl group, phenethyl group, p-sulfophenethyl group or p-carboxyphenethyl group, etc., or a vinylmethyl group.

$R_2$ represents an alkyl group (a lower alkyl group such as methyl group, ethyl group or propyl group, etc., is preferred), an aryl group (a phenyl group, p-hydroxyphenyl group, p-methoxyphenyl group, p-chlorophenyl group or naphthyl group is preferred) or a thienyl group.

Although not limitative in any fashion, as will be appreciated by one skilled in the art, for $R_1$ any alkyl moiety, for example, in sulfoalkyl, most preferably has from 1 to 5 carbon atoms and any aryl moiety, for example, in aralkyl, most preferably comprises one aromatic ring. In a similar fashion, preferred alkyl groups for $R_2$ have from 1 to 5 carbon atoms and preferred aryl groups for $R_2$ comprise one or two aromatic rings.

Z represents a group of non-metal atoms necessary to form a nitrogen containing heterocyclic nucleus as is conventionally used in cyanine dyes, for example, a thiazole, benzothiazole, naphthothiazole, indole, benzindole, naphthindole, oxazole, benzoxazole, naphthoxazole, imidazole, benzimidazole, naphthimidazole, etc., nucleus. Examples of such heterocyclic nuclei include, for instance, a benzothiazole (for example, benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole or 5,6-dimethoxybenzothiazole, etc.), a naphthothiazole (for example, α-naphthothiazole or β-naphthothiazole, etc.), a benzoselenazole (for example, benzoselenazole, 5-chlorobenzoselenazole, 6-methylbenzoselenazole or 6-methoxybenzoselenazole, etc.), a naphthoselenazole (for example, α-naphthoselenazole or β-naphthoselenazole, etc.), a benzoxazole (for example, benzoxazole, 5-methylbenzoxazole, 5-phenylbenzoxazole or 6-methoxybenzoxazole, etc.), or a naphthoxazole (for example, α-naphthoxazole or β-naphthoxazole, etc.).

Examples of compounds represented by the above described formula include 2-benzoylmethylene-3-methyl-β-naphthothiazoline, 2-benzoylmethylene-3-ethyl-β-naphthothiazoline, 3-ethyl-2-(2-thenoyl)methylene-β-naphthothiazoline, 3-ethyl-2-propionylmethylene-β-naphthothiazoline and 5-chloro-3-ethyl-2-p-methoxybenzoylmethylene-benzothiazoline, etc.

Examples of the organic sulfur compounds include di-n-butyl-disulfide, di-n-octyl-disulfide, dibenzyl-disulfide, diphenyl-disulfide, dibenzoyl-disulfide, diacetyl-disulfide, 2-mercaptobenzothiazole, 2-mercaptobenzimidazole, 2-mercaptobenzoxazole, thiophenol, thiocresol, p-methoxybenzenethiol, carboxymethyl-N,N-dimethyldithiocarbamate and ethyl-trichloromethane sulfonate, etc.

Examples of the peroxides include hydrogen peroxide, di-t-butyl peroxide, benzoyl peroxide and methyl ethyl ketone peroxide, etc.

The redox type compounds are composed of a combination of a peroxide and a reducing agent, such as ferrous ion and hydrogen peroxide, ferrous ion and persulfate ion, ferric ion and hydrogen peroxide or titanous chlorite and hydrogen peroxide, etc.

Examples of the azo and diazo compounds include α,α'-azobisisobutyronitrile, 2-azobis-2-methylbutyronitrile, 1-azobis-cyclohexane carbonitrile and the diazonium salt of p-aminodiphenylamine, etc.

Examples of the halogen compounds include chloromethylnaphthyl chloride, phenacyl chloride, chloroacetone, β-naphthalenesulfonyl chloride and xylene sulfonyl chloride, etc.

Examples of the light reducible dyes include Rose Bengale, Erythrocin, Eosine, acriflavin, riboflavin and Thionin, etc.

Examples of the imidazoles include 2-o-chlorophenyl-4,5-diphenylimidazolyl dimer, 2-o-fluorophenyl-4,5-diphenylimidazolyl dimer, 2-p-methoxyphenyl-4,5-diphenylimidazolyl dimer, 2-p-methylmercaptophenyl-4,5-diphenylimidazolyl dimer and bis-(2,4,5-triphenylimidazolyl), etc.

These photo-polymerization initiators are used in an amount of about 0.1 to about 20 parts, preferably 1 to 10 parts, by weight per 100 parts by weight of the monomer.

As the binder used in the photosensitive materials for the image recording process of the present invention, materials which satisfy the following requirements are selected from various synthetic, semi-synthetic and natural high molecular weight materials: it is required that the binder be miscible with the monomer and the photo-polymerization initiator so that separation thereof does not occur during preparation of the coating solution, application and drying; that the adhesive strength of the composition comprising the monomer and the binder to the support and to the substrate have each an appropriate value and the order (degree) of the values of adhesive strength of the composition to the support as compared that of the substrate be reversed when the monomer is converted into a polymer upon exposure to light, by which images are formed by stripping off the support; that the polymer used as the binder has properties compatible with the field of use of the image forming process of the present invention, for example, the polymer have appropriate strength, stretching capability, wear resistance and chemical resistance, etc., in the case that it is used for a photoresist material for tenting, and that the polymer have a suitable molecular weight, a suitable intermolecular force, a suitable hardness, a suitable softening point, a suitable crystallinity and a suitable breaking ductility so that one can easily destroy the photosensitive layer at the boundary between an image area and a non-image area at stripping development.

As will be appreciated by one skilled in the art, if the adhesive force to the support is too low, non-exposed portions cannot be removed with the support upon stripping development and non-exposed portions remain on the substrate as undesired fog. On the other hand, if the adhesive force to the substrate is too high and the adhesive force to the support is also high, the non-exposed layer is destroyed and separated to adhere to both the support and substrate. If adhesion to the substrate is too low, on the other hand, lamination of the layer to the substrate is impossible. One skilled in the art will, in view of the heretofore offered discussion, easily be able to balance these factors to select the optimum monomer/binder polymer combination, optimum monomer/binder ratio and the like.

Examples of the binder include chlorinated polyolefins such as chlorinated polyethylene and chlorinated polypropylene, etc., polymethyl methacrylate, polyacrylic acid, polymethacrylic acid, polyalkyl acrylates (example of the alkyl group include a methyl group, ethyl group, butyl group, etc.), copolymers of an alkyl acrylate (examples of the alkyl group are the same as above) and at least one monomer selected from acrylonitrile, vinyl chloride, vinylidene chloride, styrene and butadiene, polyvinyl chloride, copolymers of vinyl chloride and acrylonitrile, polyvinylidene chloride, copolymers of vinylidene chloride and acrylonitrile, polyvinyl acetate, copolymers of vinyl acetate and vinyl chloride, polyvinyl alcohol, polyvinyl pyrrolidone, polyacrylonitrile, copolymers of acrylonitrile and styrene, copolymers of acrylonitrile and butadiene, polyvinyl alkyl ethers (example of the alkyl group include a methyl group, ethyl group, isopropyl group, butyl group, etc.), polymethylvinylketone, polyethylvinylketone, polyethylene, polypropylene, polybutene, polystyrene, poly-α-methylstyrene, polyamides (nylon-6, nylon-6,6 etc.), poly-1,3-butadiene, polyisoprene, polyurethane, polyethylene terephthalate, chlorinated rubber or cyclized rubber such as poly-1,4-isoprene (natural or synthesized), ethyl cellulose, acetyl cellulose, polyvinyl butyral, polyvinyl formal, styrene-butadiene rubber, etc. In the case of a copolymer, though the ratio of monomer ingredients may be varied in a wide range, it is preferred that the mol% of the minor component (that is, the last-named component in any copolymer) be in the range of about 10 to less than 50 mol%. Polymers other than the above described polymers can be used as the binder in the present invention, if they satisfy the above requirements.

Among the above described polymers, particularly preferred for use as a binder in the present invention are chlorinated polyethylene, chlorinated polypropylene, polymethyl methacrylate, polyvinyl chloride, vinyl chloride-vinylidene chloride copolymers (vinyl chloride content: about 20 to about 80 mol%), vinylidene chloride-acrylonitrile copolymers (acrylonitrile content: about 10 to about 30 mol%), vinyl chloride-acrylonitrile copolymers (acrylonitrile content: about 10 to about 30 mol%), polystyrene, polyvinyl butyral, polyvinyl formal, ethyl cellulose and acetyl cellulose.

These polymers may be used alone as the binder. However, they can be used as a mixture of two or more thereof at a desired ratio if they have good miscibility so that separation does not occur at the preparation, application or drying of the coating solution.

In the image recording process of the present invention, good image capability at stripping development and good film strength of the pattern formed by development are particularly important characteristics. In general, the image capability is good when chlorinated polyethylene or chlorinated polypropylene is used as the binder. However, when these polymers are used as a major ingredient of the binder, it is sometimes difficult to obtain a pattern such as a resist film having a sufficiently high strength.

Accordingly, it is particularly preferred in the present invention to use a binder which is composed of the above described various polymers as the major ingredient and a comparatively smaller amount of chlorinated polyethylene and/or chlorinated polypropylene, that is, from 0 to less than 50 weight % based on the total weight of the binder. In this case, the ratio of the mixture can be suitably selected depending on the desired image capability or film strength. Thus, it is possible to obtain preferred properties, such as a good image capability which is obtained in the case of using chlorinated polyethylene or chlorinated polypropylene alone as the binder, and high strength, which cannot be obtained using chlorinated polyethylene or propylene alone.

The molecular weight of the high molecular materials used as the binder vary widely according to the kind of the polymers. In general, polymers having a molecular weight of about 5,000 to about 2,000,000, preferably 50,000 to 1,000,000, are suitably used in the present invention.

The amount of binder(s) for obtaining good images can also be varied within a wide range according to the kind of monomer(s) or polymer(s). In general, it is from about 2 to about 0.2 times, preferably 1.5 to 0.3 times, the weight of the monomer(s).

Though the photo-polymerizable composition used in the present invention is composed of the above described ingredients, it is preferred to add thereto a conventional heat polymerization inhibitor. Examples of the heat polymerization inhibitor include p-methoxyphenol, hydroquinone, alkyl or aryl substituted hydroquinones, most preferably where the alkyl group has from 1 to 5 carbon atoms and the aryl group comprises 1 or 2 aromatic rings, t-butyl catechol, pyrogallol, cuprous chloride, phenothiazine, chloranil, naphthylamine, β-naphthol, 2,6-di-t-butyl-p-cresol, pyridine, nitrobenzene, dinitrobenzene, p-toluidine, Methylene Blue and organic copper salts (for example, copper acetate), etc. It is preferred that the photo-polymerization inhibitor be added in an amount of about 0.001 to about 5 parts by weight based on 100 parts by weight of the monomer(s).

The photosensitive composition used in the present invention can contain various conventional additives such as a coloring agent, a plasticizer, a resin, etc. As the coloring agent, there are pigments such as titanium oxide, carbon black, iron oxide, phthalocyanine pigments and azo pigments, and dyestuffs such as Methylene Blue, Crystal Violet, Rhodamine B, Fuchsine, Auramine, azo dyes and anthraquinone dyes, etc. However, it is preferred that the coloring agent not absorb light at the activation absorption wavelength of the photo-polymerization initiator. The coloring agent is conveniently used in an amount of about 0.1 to about 30 parts by weight per 100 parts by weight of the sum total of the binder and the monomer in the case of a pigment, and about 0.01 to about 10 parts by weight, preferably 0.1 to 3 parts by weight, in the case of a dyestuff.

As a plasticizer, phthalic acid esters such as dimethyl phthalate, diethyl phthalate, dibutyl phthalate, diisobutyl phthalate, dioctyl phthalate, octyl capryl phthalate, dicyclohexyl phthalate, di-tridecyl phthalate, butyl benzyl phthalate, diisodecyl phthalate, and diallyl phthalate, etc., glycol esters such as dimethylglycol phthalate, ethyl phthalyl ethylglycolate, methylphthalyl ethylglycolate, butylphthalyl butylglycolate and triethyleneglycol dicaprylate, etc., phosphoric acid esters such as tricresyl phosphate and triphenyl phosphate, etc., aliphatic dibasic acid esters such as diisobutyl adipate, dioctyl adipate, dimethyl sebacate, dibutyl sebacate, dioctyl azelate and dibutyl maleate, etc., triethyl citrate, glycerine triacetyl ester and butyl laurate are conveniently used. The plasticizer is generally used in an amount of from 0 to about 10% by weight of the total binder weight.

The photosensitive composition used in the present invention is dissolved in a solvent to form a coating solution, which is then applied to a support and dried.

As the solvent in the coating solution, there are ketones such as acetone, methyl ethyl ketone, methyl isobutyl ketone, cyclohexanone and diisobutyl ketone, etc., esters such as ethyl acetate, butyl acetate, n-amyl acetate, methyl formate, ethyl propionate, dimethyl phthalate and ethyl benzoate, etc., aromatic hydrocarbons such as toluene, xylene, benzene and ethylbenzene, etc., halogenated hydrocarbons such as carbon tetrachloride, trichloroethylene, chloroform, 1,1,1-trichloroethane, monochlorobenzene, chloronaphthalene and dichloroethane, etc., ethers such as tetrahydrofuran, diethyl ether, ethyleneglycol monomethyl ether and ethyleneglycol monoethyl ether acetate, etc., dimethylformamide and dimethyl sulfoxide, etc. It is possible, if desired, to provide a subbing layer to facilitate adhesion, or an antihalation layer, on the surface of the support.

It is necessary that the support used in the present invention have good light transmittance, preferably a transmittance greater than 60%, and good surface uniformity. Examples of the support used include plastic films such as polyethylene terephthalate, polypropylene, polyethylene, triacetyl cellulose, diacetyl cellulose, polyvinyl chloride, polyvinyl alcohol, polycarbonate, polystyrene, cellophane, vinylidene chloride copolymers, polyamide, polyimide, vinyl chloride-vinyl acetate copolymers, polytetrafluoroethylene, polytrifluoroethylene, etc. A composite material of two or more of the above described materials can also be used.

In general, a support having about a 10 to about a 150μ, preferably a 20 to 50μ, thickness is used, but supports having a thickness outside the above range can also be used.

The layer of the above described photosensitive composition coated on the support must be thick enough to form a strong resist pattern, especially for a tenting film, but on the other hand, it cannot be too thick because the resolution of the resist image decreases with increasing thickness of the layer. One skilled in the art will easily be able to determine the optimum thickness to utilize given the above critieria. In general, the thickness is in the range of about 5 to about 100μ, preferably 10 to 60μ.

Though the recording materials of the present invention are composed of a photosensitive composition on a support, it is possible to provide, if desired, a protective film on the photosensitive composition layer. Such a protective film can suitably be selected from the above described materials for the support, as well as paper and paper laminated with polyethylene or polypropylene, etc. The thickness of the protective film is generally in a range of about 8 to about 80μ, preferably 10 to 50μ. It is necessary in this case that the adhesive strength A between the photosensitive composition layer and the support be larger than the adhesive strength B between the photosensitive composition layer and the protective film. For example, it is possible to use the support and the protective film in the combinations shown in Table 2.

TABLE 2

| | Support | Protective Film |
|---|---|---|
| (1) | Polyethylene terephthalate | Polypropylene |
| (2) | Polyethylene terephthalate | Polyethylene |
| (3) | Polyamide (Nylon-6) | Polyethylene |
| (4) | Polyvinyl chloride | Cellophane |
| (5) | Polyimide | Polypropylene |

The support and the protective film above are selected as described above so as not to be the same, however, it is possible to satisfy the above adhesive strength relationship by carrying out a surface processing of at least one of the support and the protective film. The surface processing of the support is generally carried out in order to increase the adhesive strength to the photosensitive composition layer. For example, there is the application of a subbing layer, corona discharge, flame processing, ultraviolet ray application, high frequency wave application, glow discharge, active plasma application, laser application, etc.

On the other hand, the surface processing of the protective film is generally carried out in order to lower the adhesive strength to the photosensitive composition layer. For example, applying a subbing layer of a polyorganosiloxane, a fluorinated polyolefin, polyfluoroethylene, etc.

The image forming materials used in the present invention can be produced by dissolving or dispersing the above described monomer, the photo-polymerization initiator, the binder and other desired components in a solvent, applying the resulted composition to a support by any conventional method, drying, and, if desired, superposing a protective film on the resultant layer. Drying after application is generally carried out at about 30° C. to about 110° C., preferably at 50° C. to 90° C. for about 1 to about 30 minutes.

In the case that the image forming material has a protective film, the protective film is stripped off prior to exposure, and then the photosensitive layer is pressed against the clean surface of the substrate to form a laminate.

As the substrate, various materials can be used in the present invention. For example, plastic films, paper, metal plates or glass plates, which have an adhesive strength to the photosensitive layer different from that of the support, can be used. Particularly, in the case that the present invention is used for forming photoresist images for printed circuit manufacture, the substrates which are produced by laminating or plating a thin metal layer, such as a copper, aluminium or silver, on the surface of a plastic plate or on the inside faces of through holes of a plastic plate, or substrates having a thin metal layer which is formed by depositing by evaporation or plating the metal on a thin plastic film can be used as the substrate. Further, in the case that the present invention is used for printing plate making, aluminium plates and plastic films provided with an aluminium layer can be used in addition to the above described various substrates. In this case, it is preferred that the surface of the metal layer, such as an aluminium layer, be subjected to a silicate processing or anodic oxidation.

Laminating of the photosensitive layer on the substrate can be carried out at room temperature (15°–30° C.) or with heating, e.g., to about 30° to 60° C., if desired.

The photosensitive layer on the support superposed on the substrate is image-wise exposed using an original through the transparent support. As a light source, one which emits electromagnetic waves which pass through the transparent support and which activate the photopolymerization initiator in the photosensitive layer, such as ultraviolet-visible rays having a 310 to 700 mμ, preferably a 350 to 500 mμ, wavelength, are used. For example, a high pressure mercury lamp, a xenon lamp, a carbon arc lamp, a halogen lamp and a fluorescent lamp for copying, etc., can be used. In addition, laser beams, electron beams and X-rays, etc., can be used for the exposure. One skilled in the art will easily be able to determine the optimum exposure conditions in a conventional manner. As will be appreciated, exposure conditions can vary widely; typically, with high intensity sources low times are used and with low intensity exposure sources high times are used. For example, with a 2 kw high pressure mercury lamp at a distance 50 cm from the element, typically exposure time of from about 5 to about 60 seconds are used, more conventionally from 8 to 30 seconds.

As a result of image-wise exposure, the monomer in exposed areas polymerizes to form a hardened polymer film. Consequently, the adhesive strength of the photosensitive layer to the substrate becomes higher than that to the support, though the adhesive strength of the photosensitive layer to the support is higher than that to the substrate in unexposed areas of the layer. The support is then removed by stripping off, by which the photosensitive layer in unexposed areas is removed from the substrate (preferential adhesion to the support) while the photsensitive layer (hardened polymer layer) in the exposed area remains on the substrate (preferential adhesion to the substrate). Thus, a positive image of the original used for exposure is formed on the support and a negative image is formed on the substrate.

On the other hand, it is possible to form a negative image on the support and a positive image on the substrate by selecting the support and the substrate so as to have each a differing adhesive strength for the unexposed and exposed areas which is the converse of positive image formation.

Although the temperature at stripping development is not limited, a range of about 20° to about 80° C. is convenient in practice.

As will be appreciated by one skilled in the art, for printed circuit manufacture it is generally necessary to etch prior to completion of the manufacturing process to eliminate conductor (typically, copper) from portions of the substrate which are not covered by the resist image so that only in portions where the conductor is covered will a conductive pattern remain on the substrate. In this respect, the present invention is entirely conventional, i.e., the composition and conditions used for etching can be selected from those conventionally used in the art, and can easily be determined by one skilled in the manufacture of printed circuits.

The image recording process of the present invention is suitable not only for producing, in particular, printed circuits, but it can also be used for various purposes such as for producing lithographic printing plates or relief printing plates, for producing relief molds, for optical reproduction and for photography, etc.

In the following, the present invention is illustrated in greater detail by reference to several examples of preferred embodiments of practicing the invention. In the examples, all parts are by weight unless otherwise indicated.

The chlorinated polyethylene (CPE) used in the examples had a viscosity $[\eta]=0.140$ (30° C.; benzene solution) and a chlorine content of 69% by weight, and the chlorinated polypropylene (CPP) used in the examples had a viscosity $[\eta]=0.129$ (30° C.; benzene solution) and a chlorine content of 71% by weight.

EXAMPLE 1

Polyester (meth)acrylate represented by the following formula (A) based upon the reactants reacted to give the polyester (meth)acrylate was prepared by reacting acrylic acid, methacrylic acid, glycerine and adipic acid in a molar ratio of 3/1/2/1 in toluene at 100° C. in the presence of hydroquinone as a polymerization initiator in an amount of 0.1% by weight of the sum total of acrylic acid and methacrylic acid and zinc chloride as an esterification catalyst in the same amount as the hydroquinone.

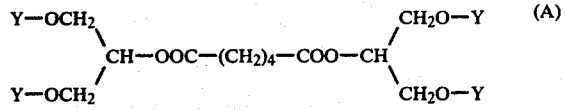

(wherein Y represents an acryloyl group or a methacryloyl group and the molar ratio of acryloyl/methacryloyl groups is 3/1 on the average).

On the other hand, polyester (meth)acrylate represented by formula (B) based upon the reactants reacted to give the polyester (meth)acrylate was synthesized in the same manner as described above from acrylic acid, methacrylic acid, diethylene glycol and phthalic acid anhydride in a molar ratio of 1/1/2/1.

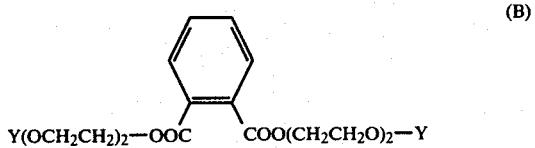

(wherein Y has the same meaning as in the case of (A) and the ratio of acryloyl/methacryloyl groups is 1/1 on the average).

Then, 1.5 parts by weight of polyester (meth)acrylate (A), 1.5 parts by weight of polyester (meth)acrylate (B), 0.1 part by weight of 2-methylanthraquinone as a photopolymerization initiator and 2.5 parts by weight of chlorinated polyethylene as a binder (Superchlon CPE-907LTA, produced by Sanyo Kokusaku Pulp Co.) were dissolved in 4.5 parts by weight of dichloroethane with stirring for 3 hours at room temperature. The solution was then applied to a polyethylene terephthalate film (support) having a 25μ thickness using a coating rod and dried at 80° C. for 10 minutes to produce an image recording material. The photosensitive layer after being dried had a 30μ thickness.

This image recording material was pressed against a clean copper substrate for printed circuits (a thin copper plate on an epoxy resin plate; having 500 through holes of a 1.5 mm diameter) at 25° C. with the surface of the photosensitive layer against the copper surface of the substrate to form a laminate.

A negative original having a pattern of a printed circuit was placed on the support of the resultant laminate and it was exposed to light for 10 seconds using a 2 Kw high pressure mercury lamp at a distance of 50 cm. The negative original had a printed circuit pattern thereon which comprised a black background having transparent line patterns thereon (the lines being 0.3–2 mm in width) joining various transparent circles at the extremities of the lines (the transparent circles being 2.5 mm in diameter). The transparent circles were, of course, aligned so as to coincide with the holes in the substrate. Accordingly, if exposure to light was carried out after the original was placed on the support so as to coincide the circle patterns with the holes of the substrate, common line resist patterns and circle resist patterns which covered all the holes and the outskirts of the holes were formed on the substrate.

The support was then stripped off at 25° C., whereby light-hardened (exposed) positive images were formed on the copper plate. The unexposed portions were removed with the support from the copper plate. All holes in the substrate were closed by a hardened film (i.e., tenting film). If the exposure was carried out for 5 seconds, incomplete images were obtained because a portion of the exposed photosensitive layer adhered to the copper plate, and the ratio of the holes of the substrate covered with the hardened film (hereinafter, called the tenting ratio; calculated as being equal to the number of holes covered by the tenting film divided by the total number of covered and uncovered holes and multiplied by 100) was only 60%.

The hardened pattern film (resist film) obtained by exposure to light for 10 seconds was then subjected to etching for 60 seconds at 40° C. using a 40° Béaqueous solution of ferric chloride by a conventional spray etching method. By carrying out this processing, the resist film except for that on the holes of the substrate did not come off and the tenting ratio was 98% (i.e., 2% of resist film on the holes were broken by spray impact).

The assembly was then washed with methyl ethyl ketone to dissolve the resist film by which the resist film was easily removed from the copper substrate and a clear copper printed circuit pattern was obtained on the epoxy resin plate.

As will be appreciated by one skilled in the art, the resist film formed in accordance with the present invention is removed using essentially conventional techniques. For instance, solvents such as dichloromethane, ethylene dichloride, methyl ethyl ketone, 1,1,1-trichloroethane and the like can be used. Commonly used conditions involve removal at room temperature by immersion for about 10 to about 300 seconds in the solvent, more commonly 30 seconds to 60 seconds.

Such operations are conventionally performed at atmospheric pressure.

COMPARISON EXAMPLE 1

In order to compare the above described case of using polyester (meth)acrylate as the monomer with the case of using other monomers, a resist pattern was formed using pentaerythritol triacrylate, a conventional monomer. The preparation of the coating solution, application and drying, lamination on the copper substrate, exposure to light and stripping development were carried out in the same manner as described above except that 3 parts by weight of pentaerythritol triacrylate were used instead of polyester (meth)acrylate.

As the result, an imperfect image was obtained even if exposure to light was for 20 seconds. In order to obtain an image having the same quality as with the polyester (meth)acrylate, it was necessary to expose for 30 seconds. In such a case, the tenting ratio was 100%.

The assembly was then subjected etching in the same manner as described above. As a result, though the resist film except for that over the holes of the substrate did not come off, the tenting ratio was only 30%.

Removal of the resist film by methyl ethyl ketone was easily carried out similarly to the above.

It is clear from the above results that the sensitivity and strength of the resist film were improved in the case of using polyester (meth)acrylate as compared with the case of using pentaerythritol triacrylate.

EXAMPLE 2

Production of a photosensitive layer and processing thereof were carried out in the same manner as in Example 1 except that 1 part by weight of polymethyl methacrylate (Sumipex BLG, produced by Sumitomo Chemical Co.; having a molecular weight of about 50,000) was used as a binder instead of chlorinated polyethylene and only 4 parts by weight of dichloroethane were used as a solvent. After exposure to light for 10 seconds and development by stripping*, exposed portions of the photosensitive layer remained on the substrate. However, non-exposed portions of the layer (which were not hardened) were not completely removed with the support from the substrate, but some of the portions, especially those adjacent exposed portions, undesirably remained on the substrate as fogging. The resist film did not come off after etching and the tenting ratio was 100%. The resist film was easily removed by washing with methyl kethyl ketone.
*all as in Example 1.

COMPARISON EXAMPLE 2

Production of the photosensitive layer and processing thereof were carried out in the same manner as in Example 2 except that 3 parts by weight of pentaerythritol triacrylate was used as the monomer instead of polyester (meth)acrylate. Exposure to light was carried out for different periods of time from 5 seconds to 30 seconds. In all cases, no image was obtained by stripping development, and both exposed portions and unexposed portions adhered to the copper substrate.

It is clear from the above results that images can be obtained by stripping development, even though polymethyl methacrylate was used as a binder, if polyester (meth)acrylate was used as the monomer, and that the strength of the tented resist film was improved.

EXAMPLE 3

Production of the photosensitive layer and processing thereof were carried out in the same manner as in Example 2 except that 0.1 part by weight of chlorinated polyethylene (the same as was used in Example 1) was used as the binder together with 1 part by weight of polymethyl methacrylate as was used in Example 2. An image of good quality similar to that obtained in Example 1 was obtained by exposure to light for 10 seconds, and fogging as in the case of Example 2, i.e., residual polymer unexposed areas on the copper plate, did not occur at all. The tenting ratio after etching was 98%. It is clear that the strength of the resist film hardly decreased by adding a small amount of chlorinated polyethylene, and image capability was highly improved as compared with the case of using polymethyl methacrylate alone as in Example 2.

COMPARISON EXAMPLE 3

Production of the photosensitive layer and processing thereof were carried out in the same manner as in Example 3 except that 3 parts by weight of pentaerythritol triacrylate was used as the monomer instead of polyester (meth)acrylate. Exposure to light was carried out for different periods of time from 5 seconds to 30 seconds. In all cases, only a slight portion of the unexposed photosensitive layer was removed together with the support and a high portion of the photosensitive layer adhered firmly to the copper plate so that, consequently, an image could hardly be obtained.

EXAMPLES 4–10

Coating solutions were prepared using monomers, photopolymerization initiators, coloring agents and solvents as shown in following Table 3 and by adding 0.1% by weight of phenothiazine based on the whole monomers as a heat polymerization inhibitor. Each solution was applied to a support and dried in the same manner as in Example 1, and thereafter pressed against a copper substrate for printed circuits at a temperature as shown in Table 3 in the same manner as in Example 1, whereafter the resultant laminate was exposed to light for 10 seconds in the same manner as in Example 1 and the support was then stripped off at a temperature as shown in Table 3 to effect development.

A resist pattern of good quality similar to that of Example 1 was thus formed on the copper plate. When the resist pattern was etched in the same manner as in Example 1, the resist film on the copper substrate (except for that over the holes) did not come off. The tenting ratio was 100% in Example 4, 97% in Example 5, 95% in Example 6, 100% in Example 7, 100% in Example 8, 100% in Example 9 and 98% in Example 10.

TABLE 3

| Ex. | Monomer | Binder | Photo-Polymerization Initiator | Coloring Agent | Solvent | Support | Lamination Temperature (°C.) | Stripping Development Temperature (°C.) |
|---|---|---|---|---|---|---|---|---|
| 4 | Monomer synthesized from acrylic acid pentaerythritol succinic acid (molar ratio:6/2/1) 6 parts<br>Monomer synthesized from acrylic acid ethylene glycol/ phthalic acid (molar ratio:2/2/1) 2 parts | Chlorinated polypropylene (Superchlon-CPP, produced by Sanyo-Kokusaku Pulp Co.; same as that in also the same viscosity) 2.5 parts | 1-Methyl-2-benzoylmethylene-β-naphthothiazoline 0.1 part | Copper phthalocyanine pigment 0.1 part | Dichloroethane 4.5 parts | Polyethylene terephthalate film (thickness: 25 μ) | 25 | 25 |
| 5 | Monomer synthesized from acrylic acid methacrylic acid/ glycerine/maleic acid (molar ratio: 3/1/2/1) 1.7 parts<br>Monomer synthesized from acrylic acid/ triethylene glycol/ trimellitic acid (molar ratio:3/3/1) 1.3 parts | Chlorinated rubber (CR-5 produced by Asahi Denka Co.) 2.5 parts | " " | " " | " | " | 25 | 25 |
| 6 | Monomer synthesized from acrylic acid/ methylacrylic acid/ pentaerythritol/ terephthalic acid (molar ratio: 4/2/2/1) 2 parts<br>Monomer synthesized from acrylic acid/ propylene glycol/ maleic acid (molar ratio:1/2/1) 1 part | Ethyl cellulose (Ethocl T-50 produced by Hercules Inc.) 2 parts | 1-Methyl-2-benzoylmethylene-β-naphthothiazoline 0.1 part | Copper phthalocyanine pigment 0.1 part | Methyl ethyl ketone 4 parts | Polyethylene-terephthalate film (thickness: 25 μ) | 45 | 25 |
| 7 | Monomer synthesized from acrylic acid methacrylic acid/ glycerine/adipic acid (molar ratio: 2/2/1) 2.5 parts<br>Pentaerythritol methacrylate 0.5 part | Saran F-220 (produced by Asashi Dow Co.) 1.5 parts<br>Chlorinated polypropylene 0.2 part | Benzoin 0.1 part | " | Dichloroethane 4.5 parts | Triacetyl cellulose film (thickness: 30 μ) | 45 | 50 |
| 8 | Monomer synthesized from acrylic acid/ polyethylene glycol (molecular weight: 400)/trimellitic 3/3/1) 2.3 parts<br>Tetraethylene glycol diacrylate 0.7 part | Cellulose acetate butyrate (EAB-500-5, produced by Co.) 2 parts | Benzil 0.2 part | Carbon black 0.1 part | Methyl ethyl ketone 5 parts | Polyethylene terephthalate film (thickness: | 25 | 50 |
| | Aronix M-8060 (produced by Toa Gosei Chemical Industry Co.) 2 parts<br>Aronix M-6100 1 part | Chlorinated polyethylene (same as used in Example 1) 2.0 parts | 9,10-PHenanthrene-quinone 0.1 part | " | Dichloroethane 4.5 parts | Polyethylene terephthalate film (thickness: 50 μ) | 20 | 20 |
| 10 | Aronix M-8030 1.5 parts<br>Aronix M-6300 1.5 parts | Poly-methyacrylate produced by Sumitomo Chemical Co.) 1 part<br>Chlorinated polyethylene (same as used in Example 1) | Benzophenone 0.1 part | Carbon black 0.1 part | Dichloroethane | Polyethylene terephthalate (thickness: 50 μ) | 20 | 50 |

TABLE 3-continued

| Ex. | Monomer | Binder | Photo-Polymerization Initiator | Coloring Agent | Solvent | Support | Lamination Temperature (°C.) | Stripping Development Temperature (°C.) |
|---|---|---|---|---|---|---|---|---|
| | | | 0.1 part | | | | | |

Synthesis of the monomers was carried out by reacting acrylic acid or methacrylic acid, the polyhydric alcohol and the polybasic acid in the molar ratio shown in Table 3 in benzene in the presence of phenothiazine by using sulfuric acid as a catalyst following the basic procedure of Example 1.

EXAMPLE 11

A solution composed of Aronix M-8060 (2 parts), Aronix M-6100 (1 part) (produced by Toa Gosei Chemical Industry Co.), pentaerythritol trimethacrylate (1 part), chlorinated polyethylene (same as used in Example 1) (2.3 parts), 2-methylanthraquinone (0.1 part), copper phthalocyanine pigment (0.1 part) and dichloroethane (5 parts) was applied to a polyethylene terephthalate film (thickness: 2.5µ) to provide a dry thickness of 40µ and dried as in Example 1. The assembly was superposed on a copper substrate, image-wise exposed to light (15 seconds) and then subjected to stripping development all in the same manner as in Example 1 (except for the exposure time), whereby a negative resist pattern of the original was formed on the substrate. When etching was carried out in the same manner as in Example 1, the tenting ratio was 98%. Removal of the resist film using methyl ethyl ketone was carried out easier than in Example 1.

EXAMPLE 12

A solution composed of Aronix M-8030 (2 parts), Aronix M-6100 (1 part) (produced by Toa Gosei Chemical Industry Co.), pentaerythritol triacrylate (2 parts), polyvinyl butyral (S-lec BLS, produced by Sekisui Chemical Co.; molecular weight: approximately 80,000) (8 parts), anthraquinone (0.2 part), copper phthalocyanine pigment (0.1 part) and dichloroethane (15 parts) was applied to a polyethylene terephthalate film (thickness: 25µ) in the same manner as in Example 1 and dried to produce a photosensitive layer having a 30µ dry thickness, which was pressed against an aluminium plate (which had been processed by dipping in an aqueous 3 wt% solution of sodium silicate at 60° C. for 1 minute) so that the surface of the photosensitive layer faced the aluminium plate to form a laminate. Then, a positive original was put in intimate contact with the support and the laminate was exposed to light for 15 seconds at a distance of 50 cm using a 2 Kw high pressure mercury lamp.

The support was then stripped off at 70° C. A positive image composed of the unhardened areas of the layer was formed on the aluminium plate while a negative image composed of areas of the layer hardened by photo-polymerization was formed on the support.

EXAMPLE 13

A photosensitive layer produced in the same manner as in Example 1 was pressed at 25° C. against an aluminium substrate for lithography which was processed in an aqueous solution of sodium silicate as in Example 12 to form a laminate which was then exposed to light (through a negative original having a type pattern which was placed on the support) for 20 seconds at a distance of 50 cm using a 2 Kw high pressure mercury lamp, whereafter the support was stripped off at 25° C., whereby a light hardened positive image was formed on the aluminium plate while unexposed areas were removed from the aluminium plate with the support (preferential adhesion to the support). The resultant printing plate was used for offset printing using an oil-soluble ink. Skipping and missing of type did not occur when 30,000 sheets of paper were printed, and thus good prints were obtained.

EXAMPLE 14

A coating solution prepared in the same manner as in Example 3 was applied as in Example 3 to a polyethylene terephthalate film (thickness: 25µ) and dried to give a product as in Example 3. It was difficult to store the resultant photosensitive plate in the superposed state or in the rolled state because the surface of the photosensitive layer had comparatively high stickiness. Therefore, a polyethylene film having a 20µ thickness was provided on the photosensitive layer as a protective layer and the resultant laminate stored for 1 month in the dark. Thereafter, the protective layer was removed and the photosensitive layer was laminated to a copper substrate and subjected to exposure and stripping development in the same manner as in Example 3. The same image as in Example 3 was obtained. The resist film did not come off after etching and the tenting ratio was 97%.

While the invention has been described in detail and with reference to specific embodiments thereof, it will be apparent to one skilled in the art that various changes and modifications can be made therein without departing from the spirit and scope thereof.

What is claimed is:

1. An image forming dry type process which comprises imagewise exposing a laminate to actinic radiation through a transparent support, said laminate composed of a substrate, a photopolymerizable composition layer and a transparent support, superposed in that order, removing either the exposed portion or the unexposed portion of said photopolymerizable composition layer together with the support by stripping said support with the exposed or unexposed composition adhered thereto from the substrate; leaving the other of the exposed portion or the unexposed portion of said photopolymerizable composition layer on said substrate, the improvement wherein said photopolymerizable composition contains (1) an addition polymerizable polyester acrylate or methacrylate selected from the group consisting of
    (a) a monomer having the formula (A)

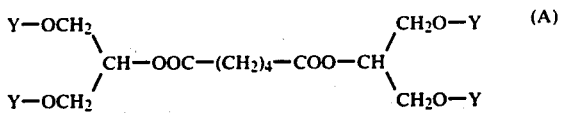

wherein Y represents an acryloyl group or a methacryloyl group and wherein the average molar ratio of acryloyl to methacryloyl groups is 3:1;

(b) a monomer having the formula (B)

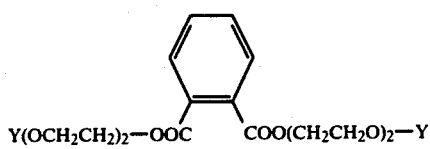

where Y represents an acryloyl group or a methacryloyl group and the average molar ratio of acryloyl groups to methacryloyl groups is 1:1;

(c) a monomer comprising the reaction product of acrylic acid, ethylene glycol and phthalic acid in a molar ratio of 2:2:1;

(d) a monomer comprising the reaction product of acrylic acid, methacrylic acid, glycerin and adipic acid in a molar ratio of 2:2:1:1;

(e) a monomer comprising the reaction product of acrylic acid, diethylene glycol and phthalic acid;

(f) a monomer comprising the reaction product of methacrylic acid, diethylene glycol and phthalic acid; and (g) a monomer comprising the reaction product of acrylic acid, trimethylolpropane and tetrahydrophthalic acid;

each polyester acrylate or methacrylate having a molecular weight within the range of 246 to about 3,000;

(2) at least one photopolymerization initiator, and (3) at least one chlorinated polyolefin binder.

2. The process of claim 1, wherein from about 0.1 to about 2 parts by weight of the at least one photo-polymerization initiator is present per 100 parts by weight of the reaction product and from about 0.2 to about 2 times the weight of the reaction product of at least one binder is present.

3. The process of claim 1, wherein the at least one chlorinated polyolefin binder comprises a first polymer in combination with less than 50 weight %, based on the total weight of the binder, of chlorinated polyethylene and/or chlorinated polypropylene.

4. The process of claim 1, wherein said binder has a molecular weight of from about 5,000 to about 2,000,000.

5. The process of claim 1, wherein said laminate is formed by pressing the photopolymerizable layer of the image forming material against the surface of the substrate at a temperature ranging from about 15° C. to about 60° C.

6. The process of claim 1, wherein said actinic radiation is selected from the group consisting of ultravioletvisible rays having wavelength of from 310 m$\mu$ to 700 m$\mu$, electron beams and X-rays.

7. The process of claim 1, wherein said photopolymerizable composition is stripped from the substrate at temperatures ranging from about 20° C. to about 80° C.

8. The process of claim 1, wherein said chlorinated polyolefin is chlorinated polyethylene, chlorinated polypropylene or a mixture thereof, and has a molecular weight of from 5,000 to about 2,000,000.

9. The process of claim 1, wherein said binder is chlorinated polyethylene having a molecular weight of about 5,000 to about 2,000,000.

10. The process of claim 1, wherein said substrate is a copper substrate or an aluminum substrate, and said transparent support is a polyethylene terephthalate film or a triacetylcellulose film.

11. The process of claim 3, wherein the first polymer is polymethyl methacrylate or a vinylidene chloride-vinyl chloride copolymer.

12. The process of claim 1, wherein said polyester acrylate or methacrylate (1) has a molecular weight of from 284 to about 2,000.

* * * * *